(12) United States Patent
Zhang et al.

(10) Patent No.: US 11,742,397 B2
(45) Date of Patent: Aug. 29, 2023

(54) SEMICONDUCTOR DEVICE AND MANUFACTURING METHOD THEREOF

(71) Applicant: INNOSCIENCE (ZHUHAI) TECHNOLOGY CO., LTD., Zhuhai (CN)

(72) Inventors: Jinhan Zhang, Zhuhai (CN); Xiaoyan Zhang, Zhuhai (CN); Kai Hu, Zhuhai (CN); Ronghui Hao, Zhuhai (CN); Junhui Ma, Zhuhai (CN)

(73) Assignee: INNOSCIENCE (ZHUHAI) TECHNOLOGY CO., LTD., Zhuhai (CN)

(*) Notice: Subject to any disclaimer, the term of this patent is extended or adjusted under 35 U.S.C. 154(b) by 127 days.

(21) Appl. No.: 17/065,533

(22) Filed: Oct. 8, 2020

(65) Prior Publication Data
US 2021/0384303 A1 Dec. 9, 2021

(30) Foreign Application Priority Data
Jun. 4, 2020 (CN) .................. 202010499349.X

(51) Int. Cl.
*H01L 29/40* (2006.01)
*H01L 21/765* (2006.01)
(Continued)

(52) U.S. Cl.
CPC .......... *H01L 29/404* (2013.01); *H01L 21/765* (2013.01); *H01L 29/2003* (2013.01);
(Continued)

(58) Field of Classification Search
CPC . H01L 23/28; H01L 23/3171; H01L 23/3192; H01L 29/122–127;
(Continued)

(56) References Cited

U.S. PATENT DOCUMENTS 9,502,548 B1 11/2016 Liao
2012/0126287 A1 5/2012 Aoki
(Continued)

FOREIGN PATENT DOCUMENTS

CN 105280695 A 1/2016
CN 110634867 A 12/2019
(Continued)

OTHER PUBLICATIONS

Takagi et al., Nitride Semiconductor Device, machine translation of JP 2015-170821, Sep. 28, 2015, pp. 1-11. (Year: 2015).*
(Continued)

*Primary Examiner* — Natalia A Gondarenko
(74) *Attorney, Agent, or Firm* — McCoy Russell LLP

(57) ABSTRACT

Embodiments of this application disclose a semiconductor device and a manufacturing method thereof. The semiconductor device includes a substrate, a first nitride semiconductor layer disposed on the substrate and having a first bandgap, and a second nitride semiconductor layer disposed on the first nitride semiconductor layer and having a second bandgap. The second bandgap is larger than the first bandgap. The semiconductor device further includes a gate contact disposed over the second nitride semiconductor layer and a first field plate disposed over the gate contact. The first field plate has a first surface facing the substrate, a second surface facing the substrate, and a protruded portion. The protruded portion has a bottom surface facing the substrate. The bottom surface is located between the first surface and the second surface.

30 Claims, 14 Drawing Sheets

(51) Int. Cl.
*H01L 29/20* (2006.01)
*H01L 29/205* (2006.01)
*H01L 29/66* (2006.01)
*H01L 29/778* (2006.01)

(52) U.S. Cl.
CPC ...... *H01L 29/205* (2013.01); *H01L 29/66462* (2013.01); *H01L 29/7786* (2013.01)

(58) Field of Classification Search
CPC ....... H01L 29/15–158; H01L 29/42316; H01L 29/6656; H01L 29/66431; H01L 29/66462; H01L 29/6653; H01L 29/66719; H01L 21/02183; H01L 21/02164; H01L 21/0228; H01L 21/02274; H01L 21/02107; H01L 21/02112; H01L 21/022; H01L 21/02208; H01L 21/82385; H01L 21/02205; H01L 21/02225; H01L 21/0229; H01L 21/2123; H01L 21/0217; H01L 21/28114; H01L 21/823468; H01L 21/823864; H01L 21/823456; H01L 29/778–7789; H01L 29/7816; H01L 29/808; H01L 2924/13064; H01L 29/404; H01L 29/2003; H01L 29/205; H01L 29/7786; H01L 29/1066; H01L 29/407; H01L 29/7781; H01L 21/765; H01L 21/7605
USPC .................... 257/76, 77, 183, 190, 194, 192
See application file for complete search history.

(56) References Cited

U.S. PATENT DOCUMENTS

2015/0357422 A1* 12/2015 Liao .................... H01L 29/7786 438/172
2020/0373420 A1* 11/2020 Chou .................. H01L 29/7786
2021/0151571 A1* 5/2021 Chou ................ H01L 29/66462

FOREIGN PATENT DOCUMENTS

JP 2015170821 A * 9/2015
JP 2015170821 A 9/2015

OTHER PUBLICATIONS

S. Mohammad Noorbakhsh et. al., "Improved 4H—SiC MESFET with double source field plate structures", Superlattices and Microstructures, May 2012, vol. 51, pp. 553-562.

Kai Zhang et. al., "Field plate structural optimization for enhancing the power gain of GaN-based HEMTs", Chinese Physics B, 2013, vol. 22 (9), 097303-1-5.

State Intellectual Property Office of the People's Republic of China, Office Action and Search Report Issued in Application No. 202010499349.X, Mar. 31, 2023, 30 pages. (Submitted with Machine Translation).

* cited by examiner

SEMICONDUCTOR DEVICE AND MANUFACTURING METHOD THEREOF

BACKGROUND OF THE INVENTION

1. Field of the Invention

This application relates to a semiconductor device and a manufacturing method thereof, and in particular, to a radio frequency semiconductor device having a field plate and a manufacturing method thereof.

2. Description of the Related Art

Components including a direct bandgap semiconductor, such as a semiconductor component including group III-V materials or group III-V compounds can operate or work under various conditions or environments (such as different voltages and frequencies) due to their characteristics.

The above semiconductor component may include a heterojunction bipolar transistor (HBT), a heterojunction field effect transistor (HFET), a high-electron-mobility transistor (HEMT) or a modulation-doped FET (MODFET), etc.

SUMMARY OF THE INVENTION

Some embodiments of the present disclosure provide a semiconductor device, including a substrate, a first nitride semiconductor layer disposed on the substrate and having a first bandgap, and a second nitride semiconductor layer disposed on the first nitride semiconductor layer and having a second bandgap. The second bandgap is larger than the first bandgap. The semiconductor device further includes a gate contact disposed over the second nitride semiconductor layer and a first field plate disposed over the gate contact. The first field plate has a first surface facing the substrate, a second surface facing the substrate, and a protruded portion. The protruded portion has a bottom surface facing the substrate. The bottom surface is located between the first surface and the second surface.

Some embodiments of the present disclosure provide a semiconductor device, including a substrate, a first nitride semiconductor layer disposed on the substrate and having a first bandgap, and a second nitride semiconductor layer disposed on the first nitride semiconductor layer and having a second bandgap. The second bandgap is larger than the first bandgap. The semiconductor device further includes a gate contact disposed over the second nitride semiconductor layer and a first field plate disposed over the gate contact. The first field plate has a first part and a second part connected to the first part. The first part is spaced apart from the gate contact in a direction substantially parallel to a surface of the substrate. A projection area of the second part on the substrate and a projection area of the gate contact on the substrate are partially overlapped. The first part has a first thickness and the second part has a second thickness. The first thickness is larger than the second thickness.

Some embodiments of the present disclosure provide a semiconductor device, including a substrate, a first nitride semiconductor layer disposed on the substrate and having a first bandgap, and a second nitride semiconductor layer disposed on the first nitride semiconductor layer and having a second bandgap. The second bandgap is larger than the first bandgap. The semiconductor device further includes a gate contact disposed over the second nitride semiconductor layer and a first field plate. The first field plate has a first surface facing the substrate, a second surface facing the substrate, a top surface opposite to the first surface, and a side surface extending between the first surface and the top surface. The side surface faces the gate contact. The first field plate further includes a protruded portion. The protruded portion has a bottom surface facing the substrate. The bottom surface is located between the first surface and the second surface.

Some embodiments of the present disclosure provide a manufacturing method of a semiconductor device. The method includes: providing a substrate, and forming a first nitride semiconductor layer having a first bandgap on the substrate. The method further includes forming a second nitride semiconductor layer on the first nitride semiconductor layer. The second nitride semiconductor layer has a second bandgap larger than the first bandgap. The method further includes: forming a first field plate on the second nitride semiconductor layer and forming a first dielectric layer on the second nitride semiconductor layer to cover the first field plate. The method further includes: forming a gate contact on the first dielectric layer, and removing a part of the first dielectric layer to form a recessed portion between the gate contact and the first field plate.

BRIEF DESCRIPTION OF THE DRAWINGS

The aspects of the present disclosure will become more comprehensible from the following detailed implementations made with reference to the accompanying drawings. It should be noted that various features may not be drawn to scale. In fact, the sizes of the various features may be increased or reduced arbitrarily for the purpose of clear description.

PREFERRED EMBODIMENT OF THE PRESENT INVENTION

Figure 1:
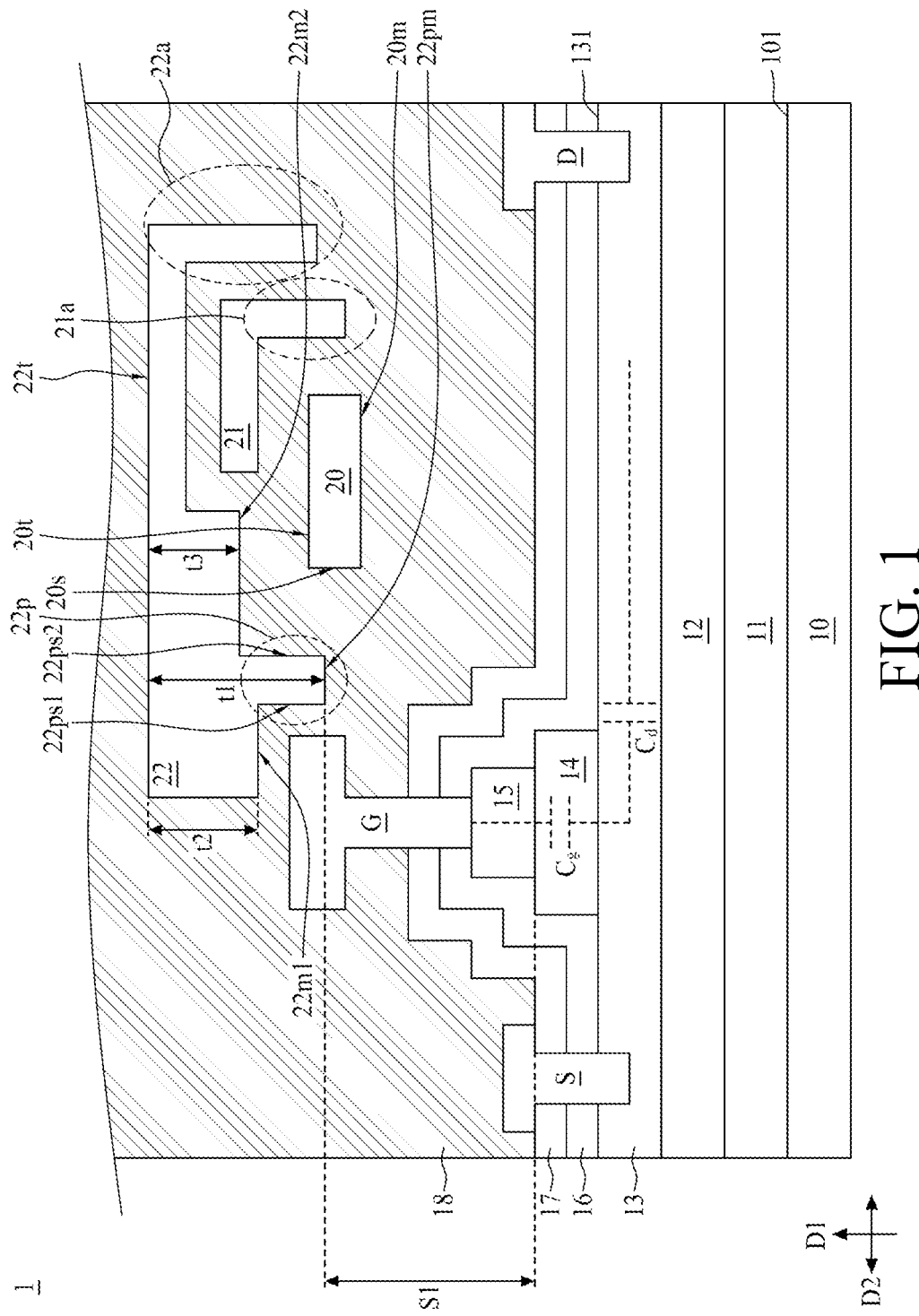
FIG. 1 is a sectional view of a semiconductor device according to some embodiments of the present disclosure.

The following disclosed content provides many different embodiments or examples of different features used to implement the provided subject matters. Specific examples of components and configurations are described below. Certainly, these specific examples are merely exemplary but not intended to be restrictive. In the present disclosure, in the following descriptions, the description of the first feature being formed on or above the second feature may include an embodiment formed by direct contact between the first feature and the second feature, and may further include an embodiment in which an additional feature may be formed between the first feature and the second feature to enable the first feature and the second feature to be not in direct contact. In addition, in the present disclosure, reference numerals and/or letters may be repeated in examples. This repetition is for the purpose of simplification and clarity, and does not indicate a relationship between the described various embodiments and/or configurations.

The embodiments of the present disclosure are described in detail below. However, it should be understood that many applicable concepts provided by the present disclosure may be implemented in a plurality of specific environments. The described specific embodiments are only illustrative and do not limit the scope of the present disclosure.

FIG. 1 shows a semiconductor device 1 according to some embodiments of the present disclosure.

As shown in FIG. 1, the semiconductor device 1 may include a substrate 10, a semiconductor layer 11, a nitride semiconductor layer 12, a nitride semiconductor layer 13, a P-type doped semiconductor layer 14, a metal layer 15, a passivation layer 16, a passivation layer 17, a dielectric layer 18, a field plate 20, a field plate 21, a field plate 22, a gate contact G, a source contact S, and a drain contact D.

In some embodiments, the substrate 10 may include, for example, but not limited to: silicon (Si), doped silicon (doped Si), silicon carbide (SiC), silicide germanium (SiGe), gallium arsenide (GaAs), or other semiconductor materials. In some embodiments, the substrate 10 may include, for example, but not limited to: sapphire, silicon on insulator (SOI), or other appropriate materials. The substrate 10 may have a surface 101. A direction D1 (or referred to as a stack direction D1) is substantially perpendicular to the surface 101. A direction D2 is substantially parallel to the surface 101.

The semiconductor layer 11 may be disposed on the surface 101 of the substrate 10. The semiconductor layer 11 may be disposed between the substrate 10 and the nitride semiconductor layer 12. In some embodiments, the semiconductor layer 11 may include a buffer layer. In some embodiments, the semiconductor layer 11 may include, for example, but not limited to, a superlattice layer. In some embodiments, the semiconductor layer 11 may include, for example, but not limited to, nitrides, for example, aluminum nitride (AlN) and aluminum gallium nitride (AlGaN). In some embodiments, the semiconductor layer 11 may be used to promote lattice matching between the substrate 10 and layers above the substrate 10 (for example, the nitride semiconductor layer 12 and/or the nitride semiconductor layer 13 located above the substrate 10). The semiconductor layer 11 may include a multi-layer structure. The semiconductor layer 11 may include a multi-layer stack. The semiconductor layer 11 may include, for example, but not limited to, a plurality of GaN layers and a plurality of AlGaN layers that are stacked alternately. In some embodiments, the semiconductor layer 11 may reduce the tensile stress of the semiconductor device 1. In some embodiments, the semiconductor layer 11 may capture electrons diffused from the substrate 10 to the nitride semiconductor layer 12 and/or the nitride semiconductor layer 13, thereby improving the performance and reliability of the device. In some embodiments, the semiconductor layer 11 may increase a breakdown voltage. In some embodiments, the semiconductor layer 11 may prevent a defect (for example, a dislocation) from propagating from the substrate 10 to the nitride semiconductor layer 12 and/or the nitride semiconductor layer 13, thereby avoiding a dysfunction of the semiconductor device 1.

The nitride semiconductor layer 12 (or referred to as a first nitride semiconductor layer in this application) may be disposed on the semiconductor layer 11. The nitride semiconductor layer 12 may be disposed between the semiconductor layer 11 and the nitride semiconductor layer 13 (or referred to as a second nitride semiconductor layer in this application). In some embodiments, the nitride semiconductor layer 12 may include, for example, but not limited to, III nitrides, for example, a compound $In_xAl_yGa_{1-x-y}N$, where $x+y \le 1$. The III nitrides may include, for example, but not limited to, a compound $Al_yGa_{(1-y)}N$, where $y \le 1$.

The nitride semiconductor layer 13 may be disposed on the nitride semiconductor layer 12. In some embodiments, the nitride semiconductor layer 13 may include, for example, but not limited to, III nitrides, for example, a compound $In_xAl_yGa_{1-x-y}N$, where $x+y \le 1$. The nitride semiconductor layer 13 may include, for example, but not limited to, a compound $Al_yGa_{(1-y)}N$, where $y \le 1$. The nitride semiconductor layer 13 may have a surface 131 facing away from the substrate 10.

In some embodiments, the nitride semiconductor layer 13 may have a larger bandgap than the nitride semiconductor layer 12. In other words, a bandgap (or referred to as a first bandgap in this application) of the nitride semiconductor layer 12 may be smaller than the bandgap (or referred to as a second bandgap in this application) of the nitride semiconductor layer 13.

For example, the nitride semiconductor layer 12 may include a GaN layer, and the GaN layer may have a bandgap of about 3.4 electron volts (eV); and the nitride semiconductor layer 13 may include an AlGaN layer, and the AlGaN layer may have a bandgap of about 4 eV. A heterojunction may be formed between the nitride semiconductor layer 12 and the nitride semiconductor layer 13, so that polarization of the heterojunction of different nitrides may occur. An electronic channel region (for example, a two-dimensional electron gas (2DEG) region) may be formed in the nitride semiconductor layer 12. In some embodiments, the nitride semiconductor layer 12 may be used as a channel layer of the semiconductor device 1, and the nitride semiconductor layer 13 may be used as a barrier layer of the semiconductor device 1.

The P-type doped semiconductor layer 14 may be disposed on the surface 131 of the nitride semiconductor layer 13. In some embodiments, the P-type doped semiconductor layer 14 may include, for example, but not limited to, a P-type doped gallium nitride, a P-type doped aluminum gallium nitride, a P-type doped indium gallium nitride, and other P-type doped III-V compounds. In some embodiments, a dopant of the P-type doped semiconductor layer 14 may include, for example, but not limited to, magnesium (Mg), zinc (Zn), cadmium (Cd), silicon (Si), germanium (Ge), or the like.

The metal layer 15 may be disposed on the P-type doped semiconductor layer 14. In some embodiments, the metal layer 15 may include, for example, but not limited to, a refractory metal, or another compound. For example, the metal layer 15 may include, for example, but not limited to, metals such as niobium (Nb), molybdenum (Mo), tantalum (Ta), wolfram (W), rhenium (Re), titanium (Ti), vanadium (V), chromium (Cr), zirconium (Zr), hafnium (Hf), ruthenium (Ru), osmium (Os), and iridium (Ir), and compounds of the metals, for example, tantalum nitride (TaN), titanium nitride (TiN), and wolfram carbide (WC).

In some embodiments, the metal layer 15 in a manufacturing process of the semiconductor device 1 may be used as a stop layer or a protection layer of the P-type doped semiconductor layer 14. For example, the metal layer 15 may enable an unexposed surface of the P-type doped semiconductor layer 14 to remain substantially and relatively flat in a process of using a removal technology (for example, an etching technology). In some embodiments, the metal layer 15 helps to improve a bias control on the gate contact G. In some embodiments, the metal layer 15 helps to improve a switching speed of a gate. In some embodiments, the metal layer 15 helps to reduce a leakage current and improve a threshold voltage.

The gate contact G may be disposed on the metal layer 15. The metal layer 15 may be disposed between the gate contact G and the P-type doped semiconductor layer 14. In some embodiments, the gate contact G may include, for example, but not limited to, titanium (Ti), tantalum (Ta), wolfram (W), aluminum (Al), cobalt (Co), copper (Cu), nickel (Ni), platinum (Pt), plumbum (Pb), molybdenum (Mo), and compounds thereof (for example, but not limited to, titanium nitride (TiN), tantalum nitride (TaN), other conductive nitrides), or other conductive oxides), metal alloy (for example, aluminum copper alloy (Al—Cu)), or other appropriate materials.

The passivation layer 16 may be disposed on the nitride semiconductor layer 13. The passivation layer 16 may be disposed between the passivation layer 17 and the nitride semiconductor layer 13. The passivation layer 16 may surround the P-type doped semiconductor layer 14. The passivation layer 16 may cover the P-type doped semiconductor layer 14. The passivation layer 16 may surround the metal layer 15. The passivation layer 16 may cover the metal layer 15. The passivation layer 16 may partially cover the metal layer 15. The passivation layer 16 may surround the gate contact G. The passivation layer 16 may partially surround the gate contact G. In some embodiments, the passivation layer 16 may include, for example, but not limited to, oxides or nitrides. In some embodiments, the passivation layer 16 may include, for example, but not limited to, silicon nitride ($Si_3N_4$), silicon oxide ($SiO_2$), or other appropriate materials. In some embodiments, the passivation layer 16 may include, for example, but not limited to, compound layers of oxides and nitrides, for example, $Al_2O_3/Si_3N_4$, $Al_2O_3/SiO_2$, $AlN/Si_3N_4$, and $AlN/SiO_2$.

The passivation layer 17 may be disposed on the passivation layer 16. The passivation layer 17 may surround the gate contact G. The passivation layer 17 may partially surround the gate contact G. In some embodiments, the passivation layer 17 may include, for example, but not limited to, the materials listed above for the passivation layer 16.

The source contact S may be disposed on the nitride semiconductor layer 13. The source contact S may run through the passivation layer 16 and the passivation layer 17 to be in contact with the nitride semiconductor layer 13. The source contact S may be locally located in the nitride semiconductor layer 13. In some embodiments, the source contact S may include, for example, but not limited to, conductor materials. In some embodiments, the source contact S may include, for example, but not limited to, metal, alloy, doped semiconductor materials (for example, doped crystalline silicon), or other appropriate conductor materials.

The drain contact D may be disposed on the nitride semiconductor layer 13. The drain contact D may run through the passivation layer 16 and the passivation layer 17 to be in contact with the nitride semiconductor layer 13.

The drain contact D may be locally located in the nitride semiconductor layer 13. In some embodiments, the drain contact D may include, for example, but not limited to, conductor materials. In some embodiments, the drain contact D may include, for example, but not limited to, metal, alloy, doped semiconductor materials (for example, doped crystalline silicon), or other appropriate conductor materials.

Although the source contact S and the drain contact D are separately disposed at two sides of the gate contact G in FIG. 1, locations of the source contact S, the drain contact D, and the gate contact G may have different configurations in other embodiments of the present disclosure according to design requirements.

The dielectric layer 18 may be disposed on the passivation layer 17. The dielectric layer 18 may surround the gate contact G. The dielectric layer 18 may cover the gate contact G. The dielectric layer 18 may cover the source contact S. The dielectric layer 18 may cover the drain contact D. In some embodiments, the dielectric layer 18 may include, for example, but not limited to, the materials listed above for the passivation layer 16. In some embodiments, the dielectric layer 18 may include materials that are different from the passivation layer 16 and/or the passivation layer 17, for example, other dielectric materials.

The field plate 20 may be disposed on the passivation layer 17. The field plate 20 may be disposed in the dielectric layer 18. The field plate 20 may be surrounded by the dielectric layer 18. The field plate 20 may be covered by the dielectric layer 18. The field plate 20 may be adjacent to the gate contact G. For example, the field plate 20 may be adjacent to the gate contact G in the direction D2. For example, the field plate 20 may be configured with the gate contact G side-by-side in the direction D2. For example, the field plate 20 may be located at a side of the gate contact G in the direction D2. The field plate 20 may be connected to the source contact S and/or the drain contact D through other conductor structures.

The field plate 20 may have a bottom surface 20*m* facing the passivation layer 17 (or facing the substrate 10), a top surface 20*t* opposite to the bottom surface 20*m*, and a side surface 20*s* extending between the bottom surface 20*m* and the top surface 20*t*. The side surface 20*s* may face the gate contact G. For example, in the direction D2, the side surface 20*s* and the gate contact G may be aligned or overlapped. For example, in the direction D2, the side surface 20*s* and the gate contact G may be separated by the dielectric layer 18. In some embodiments, the field plate 20 may include, for example, but not limited to, a conductive material such as a metal or an alloy.

The field plate 21 may be disposed on the field plate 20. The field plate 21 may be disposed between the field plate 20 and the field plate 22. The field plate 21 may be disposed in the dielectric layer 18. The field plate 21 may be surrounded by the dielectric layer 18. The field plate 21 may be covered by the dielectric layer 18. In the direction D1, the field plate 21 and the field plate 20 may be at least locally overlapped. For example, in the direction D1, the field plate 21 and the field plate 20 may be separated by the dielectric layer 18. For example, a projection area of the field plate 21 on the substrate 10 and a projection area of the field plate 20 on the substrate 10 may be at least locally overlapped or coincided. The field plate 21 may be connected to the source contact S and/or the drain contact D through other conductor structures.

The field plate 21 may cover a corner or an edge of the field plate 20. As shown in FIG. 1, a part of the field plate 21 is circled with a dashed line, and the field plate 21 may have a bent portion 21*a*. The bent portion 21*a* may extend in the direction D1. The bent portion 21*a* and the corner or the edge of the field plate 20 may be separated by the dielectric layer 18. In some embodiments, the field plate 21 may not have the bent portion 21*a*. In other words, the field plate 21 may substantially extend in the direction D2, and does not have the bent portion 21*a* extending toward the direction D1. It should be noted that, compared with the field plate 21 not having the bent portion 21*a*, the field plate 21 having the bent portion 21*a* can reduce a gate-to-drain capacitance ($C_{gd}$, that is, an equivalent gate-to-drain capacitance formed by $C_g$ and $C_d$ in FIG. 1) between the gate contact G and the drain contact D more effectively. In some embodiments, the field plate 21 may include, for example, but not limited to, a conductive material such as a metal or an alloy. In some embodiments, the field plate 21 and the gate contact G may be formed together. For example, materials of the field plate 21 and the gate contact G may be deposited together in the same deposition step (further described below referring to FIG. 5F and FIG. 5G).

The field plate 22 may be disposed on the field plate 21. The field plate 22 may be connected to the source contact S and/or the drain contact D through other conductor structures. In some embodiments, the field plate 22 may include, for example, but is not limited to, a conductive material such as a metal or an alloy. In the direction D1, the field plate 22 and the field plate 21 may be at least partially overlapped. For example, in the direction D1, the field plate 22 and the field plate 21 may be completely overlapped. For example, in the direction D1, the field plate 22 and the field plate 21 may be separated by using the dielectric layer 18. For example, a projection area of the field plate 22 on the substrate 10 and a projection area of the field plate 21 on the substrate 10 may be at least partially overlapped or coincided. For example, a projection area of the field plate 22 on the substrate 10 and a projection area of the field plate 21 on the substrate 10 may be completely overlapped. In the direction D1, the field plate 22 and the field plate 20 may be at least partially overlapped. For example, in the direction D1, the field plate 22 and the field plate 20 may be completely overlapped or coincided. For example, in the direction D1, the field plate 22 and the field plate 20 may be separated by using the dielectric layer 18. For example, a projection area of the field plate 22 on the substrate 10 and a projection area of the field plate 20 on the substrate 10 may be at least partially overlapped or coincided. For example, a projection area of the field plate 22 on the substrate 10 and a projection area of the field plate 20 on the substrate 10 may be completely overlapped or coincided. In the direction D1, the field plate 22 and the gate contact G may be at least partially overlapped. For example, in the direction D1, the field plate 22 and the gate contact G may be separated by using the dielectric layer 18. For example, a projection area of the field plate 22 on the substrate 10 and a projection area of the gate contact G on the substrate 10 may be at least partially overlapped or coincided.

The field plate 22 may have a top surface 22*t* facing away from the passivation layer 17 (or facing away from the substrate 10). The field plate 22 may have a protruded portion 22*p* and a bent portion 22*a* (a part of the field plate 22 circled with a dashed line shown in FIG. 1) extending toward the passivation layer 17 (or toward the substrate 10). The protruded portion 22*p* may protrude or extend from any location on a surface opposite to the top surface 22*t*. Relative to the protruded portion 22*p*, the bent portion 22*a* is located at an edge of the field plate 22. For example, the bent portion 22*a* protrudes from the edge of the field plate 22. For example, the bent portion 22*a* has a surface connected to or continuous with the top surface 22*t*. In other words, a surrounding of the protruded portion 22*p* is adjacent to the surface of the field plate 22 facing the substrate 10. In other words, the protruded portion 22*p* is surrounded by the surface of the field plate 22 facing the substrate 10. In other words, the protruded portion 22*p* protrudes compared with the surrounding (or adjacent) surface.

The protruded portion 22*p* may be located between the field plate 21 and the gate contact G. The protruded portion 22*p* may be located between the field plate 20 and the gate contact G. In some embodiments, the protruded portion 22*p* may be closer to the P-type doped semiconductor layer 14 (or closer to the substrate 10) than the field plate 21 is. In some embodiments, the protruded portion 22*p* may be closer to the P-type doped semiconductor layer 14 (or closer to the substrate 10) than the field plate 20 is. For example, the protruded portion 22*p* has a bottom surface 22*pm* facing the substrate 10, and a distance Si between the bottom surface 22*pm* and the surface 131 of the nitride semiconductor layer 13 may be about between 100 nanometers (nm) to 300 nm, for example, about 110 nm, about 120 nm, about 130 nm, about 140 nm, about 150 nm, about 160 nm, about 170 nm, about 180 nm, about 190 nm, about 200 nm, about 210 nm, about 220 nm, about 230 nm, about 240 nm, about 250 nm, about 260 nm, about 270 nm, about 280 nm, or about 290 nm.

The closer the protruded portion 22*p* is to the P-type doped semiconductor layer 14 (or to the substrate 10), the more influence it has on the 2DEG region and the more distribution of the 2DEG is changed. More specifically, the closer the protruded portion 22*p* is to the P-type doped semiconductor layer 14 (or to the substrate 10), the lower the 2DEG density at one side of the drain contact D is, thereby reducing the gate-to-drain capacitance $C_{GD}$ and improving and amplifying the gain.

Continue to refer to FIG. 1, in some embodiments, the top surface 22*t* may have a substantially flat surface. For example, the top surface 22*t* of the field plate 22 may be located at the same horizontal level in the direction D1. Compared with the top surface 22*t*, the field plate 22 has a surface 22*m*1 facing the passivation layer 17 (or facing the substrate 10), a bottom surface 22*pm* facing the passivation layer 17 (or facing the substrate 10), and a surface 22*m*2 facing the passivation layer 17 (or facing the substrate 10). The protruded portion 22*p* protrudes between the surface 22*m*1 and the surface 22*m*2. The protruded portion 22*p* protrudes between the surface 22*m*1 and the surface 22*m*2 toward the passivation layer 17 (or toward the substrate 10). The protruded portion 22*p* has a bottom surface 22*pm* facing the passivation layer 17 (or facing the substrate 10). The bottom surface 22*pm* is located between the surface 22*m*1 and the surface 22*m*2.

In some embodiments, any two of the surface 22*m*1, the surface 22*m*2, and the bottom surface 22*pm* may not be coplanar. For example, any two of the surface 22*m*1, the surface 22*m*2, and the bottom surface 22*pm* may not be in the same horizontal plane. For example, any two of the surface 22*m*1, the surface 22*m*2, and the bottom surface 22*pm* may be located in different horizontal levels in the direction D1. For example, the surface 22*m*1 and the bottom surface 22*pm* may not be coplanar. For example, the surface 22*m*2 and the bottom surface 22*pm* may not be coplanar. For example, the surface 22*m*1 and the surface 22*m*2 may not be coplanar. In some embodiments, the bottom surface 22*pm* may be closer to the P-type doped semiconductor layer 14 (or closer to the substrate 10) relative to the surface 22*m*1 and the surface 22*m*2.

The surface 22*m*1 may be connected to the bottom surface 22*pm* through a side surface 22*ps*1. In some embodiments, the side surface 22*ps*1 may face the gate contact G. The surface 22*m*2 may be connected to the bottom surface 22*pm* through a side surface 22*ps*2. In some embodiments, the side surface 22*ps*2 may be opposite to the side surface 22*ps*1 and face away from the gate contact G. The side surface 22*ps*2 may face the field plate 21. The side surface 22*ps*2 may face the field plate 20. The side surface 22*ps*1, the side surface 22*ps*2, and the bottom surface 22*pm* may define the protruded portion 22*p*.

A distance between the top surface 22*t* and the bottom surface 22*pm* may be defined as a thickness 1 (t1). A distance between the top surface 22*t* and the surface 22*m*1 may be defined as a thickness 2 (t2). A distance between the top surface 22*t* and the surface 22*m*2 may be defined as a thickness 3 (t3), t1, t2, and t3 may be measured in the direction D1. In some embodiments, t1, t2, and t3 may have the same measurement starting point, for example, the top surface 22*t*. In some embodiments, t1 may be different from t2 and t3. For example, t1 may be greater than t2. For example, t1 may be greater than t3. In some embodiments, t2 may be different from t3. In some embodiments, t2 may be the same as t3.

In some embodiments, t1, t2, and t3 may define a part (for example, referred to as a first part, a second part, and a third part in this application) of the field plate 22 respectively. In other words, a part having t1 may be referred to as the first part, a part having t2 may be referred to as the second part, and a part having t3 may be referred to as the third part. The first part may be connected to the second part. The first part may be connected to the third part. The first part may be located between the second part and the third part. The first part, the second part, and the third part may not be clearly defined from one to the other, for example, the first part, the second part, and the third part may be integrally formed. For brevity, the first part, the second part, and the third part are not marked in the drawings. In some embodiments, the first part, the second part, and the third part may be coplanar with each other. For example, the first part, the second part, and the third part may share a substantially flat top surface 22*t*.

In the direction D1, the second part defined by t2 and the gate contact G may be at least partially overlapped. For example, in the direction D1, the second part defined by t2 and the gate contact G may be separated by the dielectric layer 18. For example, a projection area of the second part defined by t2 on the substrate 10 and a projection area of the gate contact G on the substrate 10 may be at least partially overlapped or coincided.

In the direction D1, the first part defined by t1 and the gate contact G may not be overlapped. For example, a projection area of the first part defined by t1 on the substrate 10 and a projection area of the gate contact G on the substrate 10 may not be overlapped.

In some embodiments, the field plate 22 may not have the protruded portion 22*p*. In other words, the field plate 22 may only have the bent portion 22*a* extending toward the direction D2. It should be noted that, compared with the field plate 22 not having the protruded portion 22*p* but only having the bent portion 22*a*, the field plate 22 having the protruded portion 22*p* can reduce a gate-to-drain capacitance $C_{GD}$ between the gate contact G and the drain contact D more effectively. It should be noted that, compared with the field plate 22 not having the protruded portion 22*p* but only having the bent portion 22*a*, the field plate 22 having the protruded portion 22*p* and the bent portion 22*a* can reduce the gate-to-drain capacitance $C_{GD}$ between the gate contact G and the drain contact D more effectively. In addition, the field plate 22 having the protruded portion 22*p* may cover one side of the gate contact G to reduce the electric field peak value here. In other words, the surface 22*m*1 and the side surface 22*ps*1 of the field plate 22 may cover one side of the gate contact G to reduce the electric field peak value here.

Although the semiconductor device 1 described in this application has three field plates (the field plate 20, the field plate 21, and the field plate 22), this application is not limited thereto. For example, in some embodiments, the semiconductor device 1 may have any quantity of field plates according to the device specification. In some embodiments, a quantity of increased field plates may adjust the surface electric field distribution step by step. The changes of the thickness and the increase of the coverage area of the field plate may reduce the resistance of the field plate and the loss of a radio frequency signal.

As described above, in this application, the protruded portion 22*p* is formed to be adjacent to the P-type doped semiconductor layer 14 (or adjacent to the substrate 10), so as to reduce the 2DEG density at one side of the drain contact D, thereby reducing the gate-to-drain capacitance $C_{GD}$ and improving and amplifying the gain. However, this application is not limited thereto. For example, in some embodiments, the protruded portion 22*p* of the field plate 22 described in this application may be also applied to other semiconductor devices, for example, other HEMT devices. For example, in some embodiments, the protruded portion 22*p* of the field plate 22 described in this application may be also applied to other HEMT devices not having the P-type doped semiconductor layer 14 and/or the metal layer 15.

Figure 2:
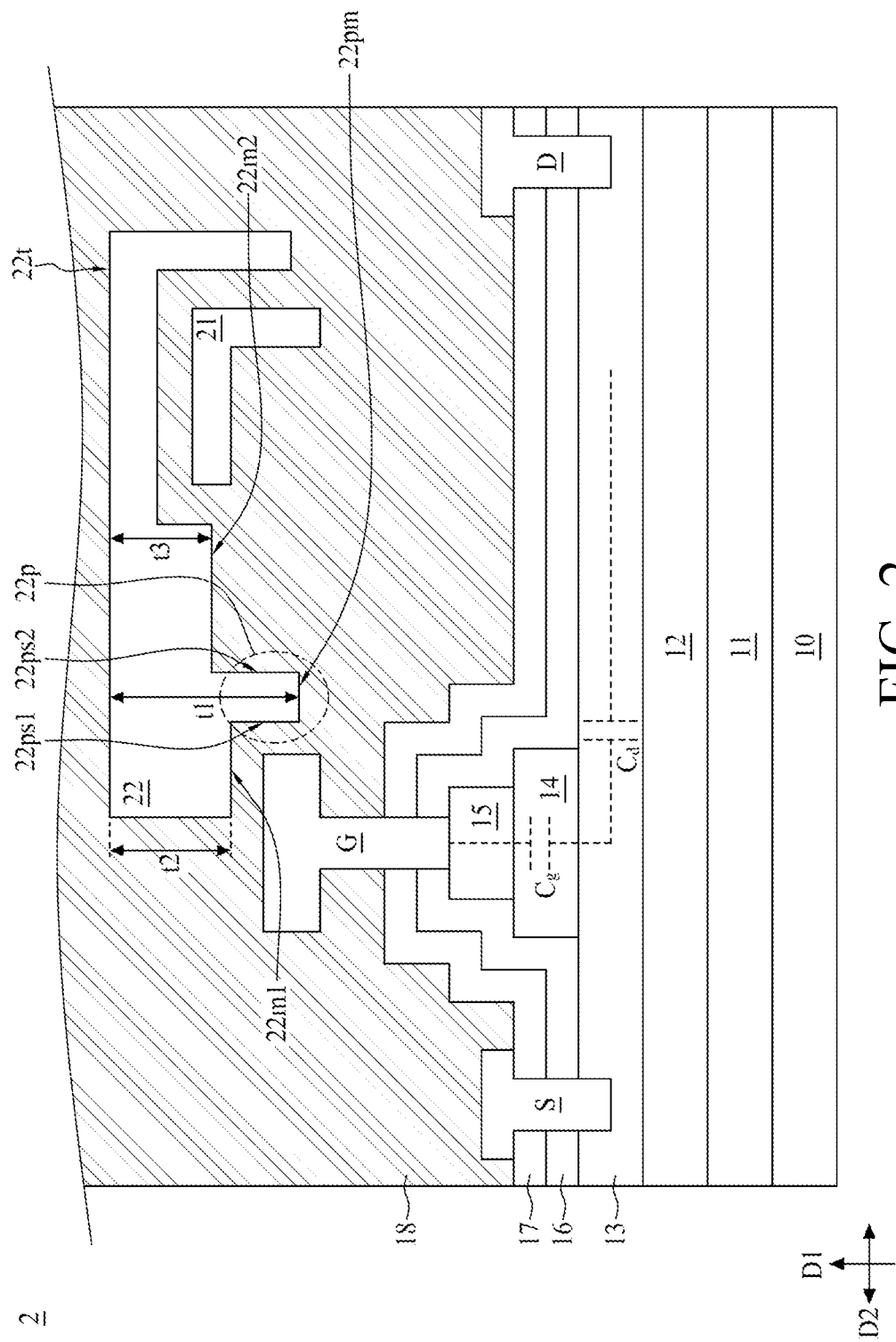
FIG. 2 is a sectional view of a semiconductor device according to some embodiments of the present disclosure.

FIG. 2 shows a semiconductor device 2 according to some embodiments of the present disclosure.

The semiconductor device 2 shown in FIG. 2 is similar to the semiconductor device 1 shown in FIG. 1, except that the semiconductor device 2 omits the field plate 20. In some embodiments, the protruded portion 22*p* of the field plate 22 of the semiconductor device 2 may be closer to the P-type doped semiconductor layer 14 (or closer to the substrate 10), so as to reduce the 2DEG density at one side of the drain contact D more effectively, thereby reducing the gate-to-drain capacitance $C_{GD}$ and improving and amplifying the gain.

Figure 3:
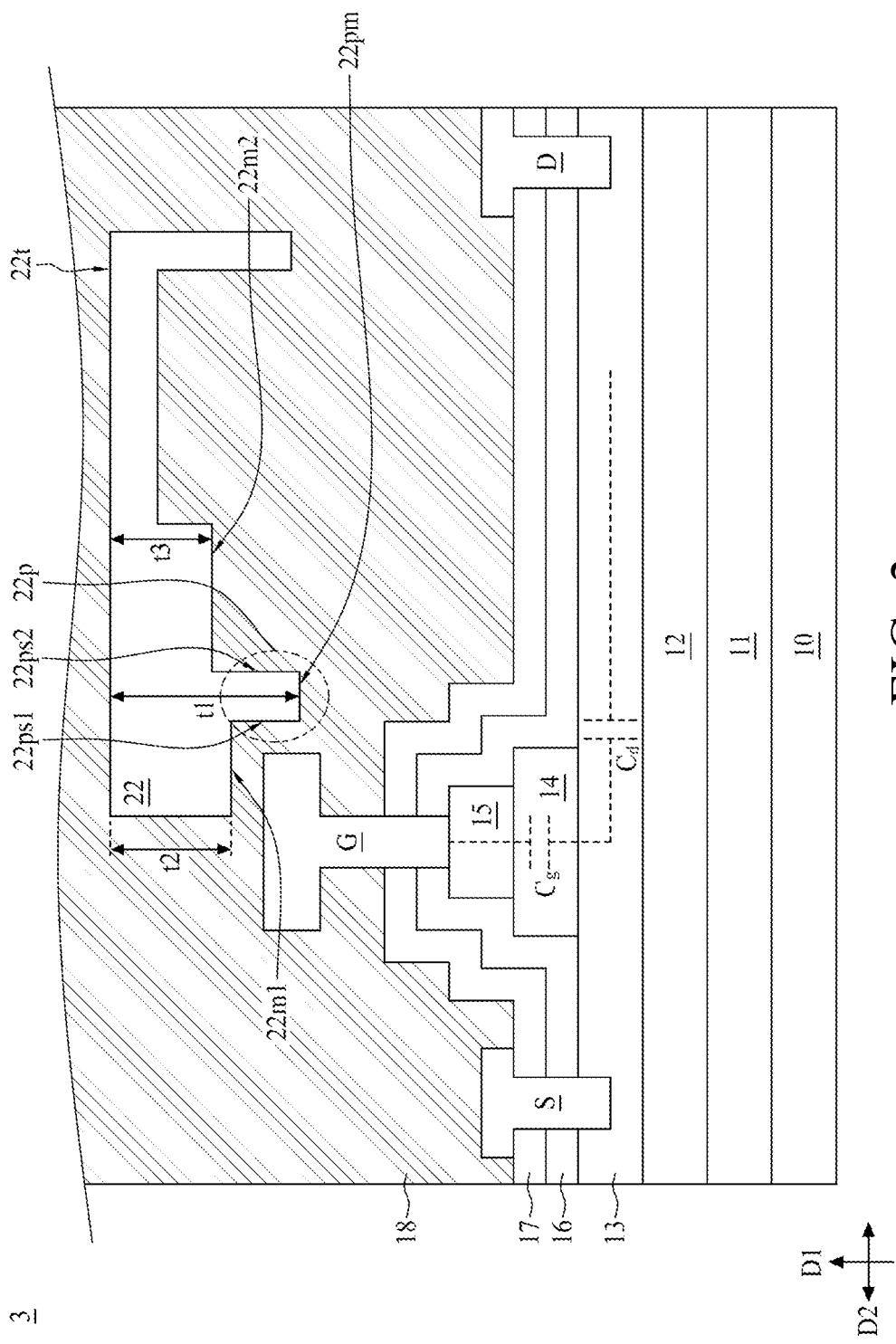
FIG. 3 is a sectional view of a semiconductor device according to some embodiments of the present disclosure.

FIG. 3 shows a semiconductor device 3 according to some embodiments of the present disclosure.

The semiconductor device 3 shown in FIG. 3 is similar to the semiconductor device 2 shown in FIG. 2, except that the semiconductor device 3 omits the field plate 21. In some embodiments, the protruded portion 22*p* of the field plate 22 of the semiconductor device 3 may be closer to the P-type doped semiconductor layer 14 (or closer to the substrate 10), so as to reduce the 2DEG density at one side of the drain contact D more effectively, thereby reducing the gate-to-drain capacitance $C_{GD}$ and improving and amplifying the gain.

Figure 4:
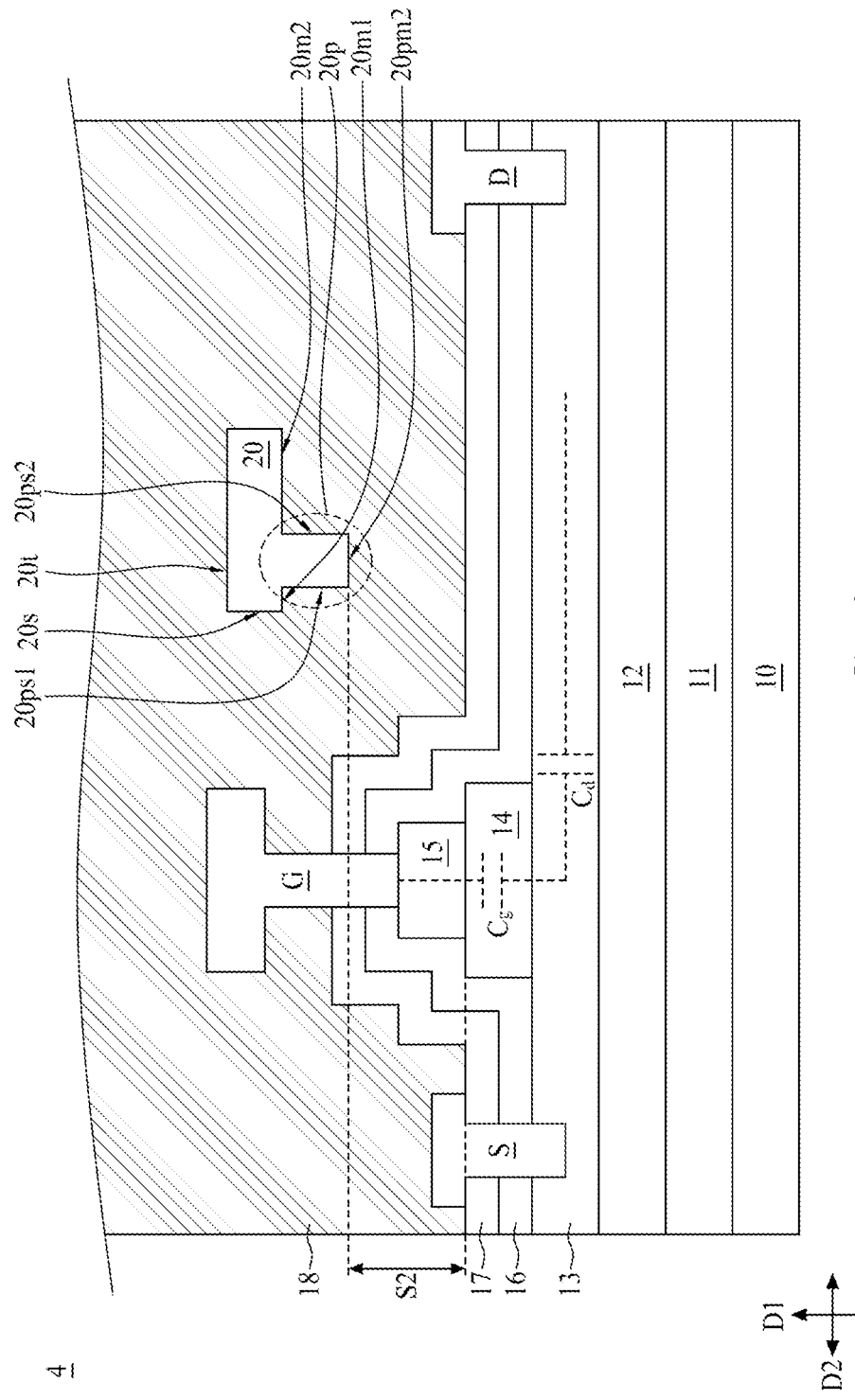
FIG. 4 is a sectional view of a semiconductor device according to some embodiments of the present disclosure.

FIG. 4 shows a semiconductor device 4 according to some embodiments of the present disclosure.

The semiconductor device 4 shown in FIG. 4 is similar to the semiconductor device 1 shown in FIG. 1, except that the semiconductor device 4 only has the field plate 20 but does not have the field plate 21 or the field plate 22, and the shape of the field plate 20 is changed. The field plate 20 shown in FIG. 4 may have a top surface 20*t* facing away from the passivation layer 17 (or facing away from the substrate 10). In some embodiments, the top surface 20*t* may have a substantially flat surface.

Still referring to FIG. 4, compared with the top surface 20*t*, the field plate 20 may have a surface 20*m*1 facing the passivation layer 17 (or facing the substrate 10) and a surface 20*m*2 facing the passivation layer 17 (or facing the substrate 10). The field plate 20 may have a protruded portion 20*p* protruding from the surface 20*m*1 and the surface 20*m*2. The protruded portion 20*p* may be located between the surface 20m1 and the surface 20m2. The protruded portion 20p may have a bottom surface 20pm facing the passivation layer 17 (or facing the substrate 10), and the bottom surface 20pm may be located between the surface 20m1 and the surface 20m2.

In some embodiments, the bottom surface 20pm may be closer to the P-type doped semiconductor layer 14 (or closer to the substrate 10) than the surface 20m1 and the surface 20m2 are. For example, a distance S2 between the bottom surface 20pm and the surface 131 of the nitride semiconductor layer 13 may be about between 50 nm to 250 nm, for example, about 60 nm, about 70 nm, about 80 nm, about 90 nm, about 100 nm, about 110 nm, about 120 nm, about 130 nm, about 140 nm, about 150 nm, about 160 nm, about 170 nm, about 180 nm, about 190 nm, about 200 nm, about 210 nm, about 220 nm, about 230 nm, or about 240 nm.

The surface 20m1 may be connected to the bottom surface 20pm through a side surface 20ps1. In some embodiments, the side surface 20ps1 may face the gate contact G. The surface 20m2 may be connected to the bottom surface 20pm through a side surface 20ps2. In some embodiments, the side surface 20ps2 may be opposite to the side surface 20ps1 and face away from the gate contact G. The side surface 20ps1, the side surface 20ps2, and the bottom surface 20pm may define the protruded portion 20p of the field plate 20.

Compared with the protruded portion 22p of the semiconductor device 1, the protruded portion 20p of the field plate 20 may be closer to the P-type doped semiconductor layer 14 (or closer to the substrate 10), so as to reduce the 2DEG density at one side of the drain contact D more effectively, thereby reducing the gate-to-drain capacitance $C_GD$ and improving and amplifying the gain.

It should be noted that, values like the length, the width, and the distance described in the present disclosure are merely exemplary, and the present disclosure is not limited thereto. In some embodiments, these values may be adjusted according to actual applications of the present invention without departing from the invention spirit of the present disclosure.

FIG. 5A, FIG. 5B, FIG. 5C, FIG. 5D, FIG. 5E, FIG. 5F, FIG. 5G, FIG. 5H, FIG. 5I, and FIG. 5J show several operations of manufacturing a semiconductor device according to some embodiments of the present disclosure. FIG. 5A to FIG. 5J may depict several operations of manufacturing the semiconductor device 1, and the similar operations may also be used for manufacturing the semiconductor device 2, the semiconductor device 3, or the semiconductor device 4.

Figure 5A:
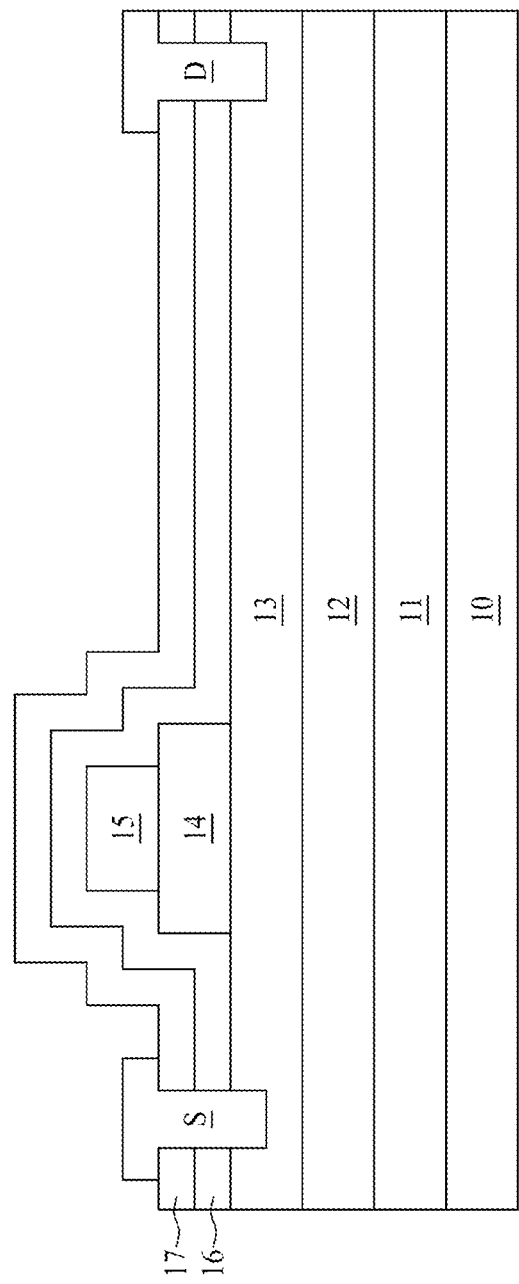
FIG. 5A, FIG. 5B, FIG. 5C, FIG. 5D, FIG. 5E, FIG. 5F, FIG. 5G, FIG. 5H, FIG. 5I, and FIG. 5J show several operations of manufacturing a semiconductor device according to some embodiments of the present disclosure.

Referring to FIG. 5A, first, a substrate 10 is provided. Next, a semiconductor layer 11, a nitride semiconductor layer 12, a nitride semiconductor layer 13, a P-type doped semiconductor layer 14, a metal layer 15, a passivation layer 16, and a passivation layer 17 are formed on the substrate 10.

In some embodiments, the semiconductor layer 11, the nitride semiconductor layer 12, and the nitride semiconductor layer 13 may be formed through metal organic chemical vapor deposition (MOCVD), epitaxial growth, or other appropriate deposition steps.

In some embodiments, materials of the P-type doped semiconductor layer may be formed through the MOCVD, the epitaxial growth, or other appropriate deposition steps, and a dopant is doped in the materials. Then, a patterned hard mask (or a photomask) may be formed above the materials of the P-type doped semiconductor layer. Then, a part of the materials of the P-type doped semiconductor layer may be removed, for example, in a photolithography manner, to form the P-type doped semiconductor layer 14. In some embodiments, the patterned hard mask may include (but not limited to) silicon nitride (SiN), silicon oxynitride (SiON), silicon carbide (SiC), and the like. In some embodiments, the etching step may be performed through dry etching, wet etching, or a combination of dry etching and wet etching.

In some embodiments, the materials of the metal layer may be formed through physical vapor deposition (PVD), chemical vapor deposition (CVD), atomic layer deposition (ALD), plating, and/or other appropriate deposition steps. Then, a part of the materials of the metal layer may be removed, for example, in the foregoing photolithography manner, to form the metal layer 15.

In some embodiments, the materials of the P-type doped semiconductor layer 14 and the materials of the metal layer 15 may be etched by using the same patterned hard mask.

In some embodiments, the passivation layer 16 and the passivation layer 17 may be formed through CVD, high density plasma (HDP) CVD, spin-on, sputtering, and other manners.

After the passivation layer 17 is formed, a source contact S and a drain contact D may be formed. In some embodiments, a part of the passivation layer 16, a part of the passivation layer 17, and a part of the nitride semiconductor layer 13 may be removed by using one or more etching processes to form an opening, and then a conductive material is filled into the opening through CVD, PVD, plating, and other deposition steps. In some embodiments, after the materials are filled into the opening, the deposited materials may be etched again through a photomask to form a required electrode structure, so as to form the source contact S and the drain contact D, so that the source contact S and the drain contact D are in contact with the nitride semiconductor layer 13. The source contact S and the drain contact D may be formed through sputtering, PVD, or other appropriate processes. In some embodiments, the conductive material (for example, the source contact S and the drain contact D) and the nitride semiconductor layer 13 may form an intermetallic compound through rapid thermal anneal (RTA), to further form ohmic contacts.

Figure 5B:
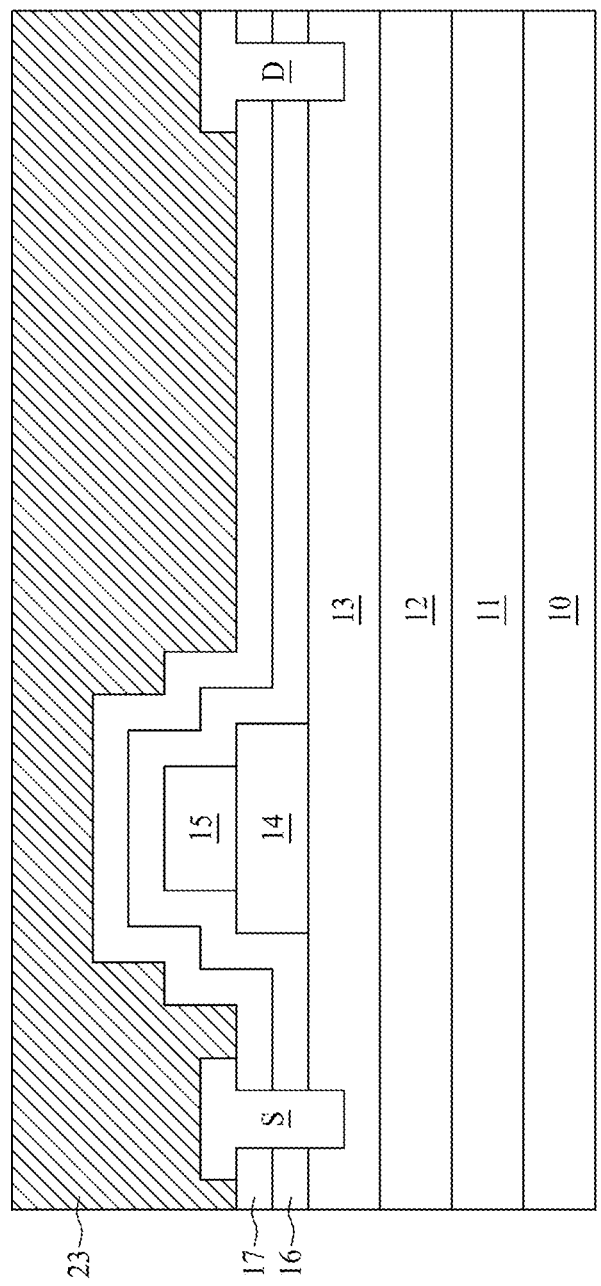

Referring to FIG. 5B, a dielectric layer 23 is deposited on the passivation layer 17 to cover the source contact S and the drain contact D. In some embodiments, the dielectric layer 23 may be deposited through the following manners: CVD, HDPCVD, spin-on, sputtering, and the like. Next, a surface of the dielectric layer 23 may be processed by using chemical-mechanical planarization (CMP).

Figure 5C:
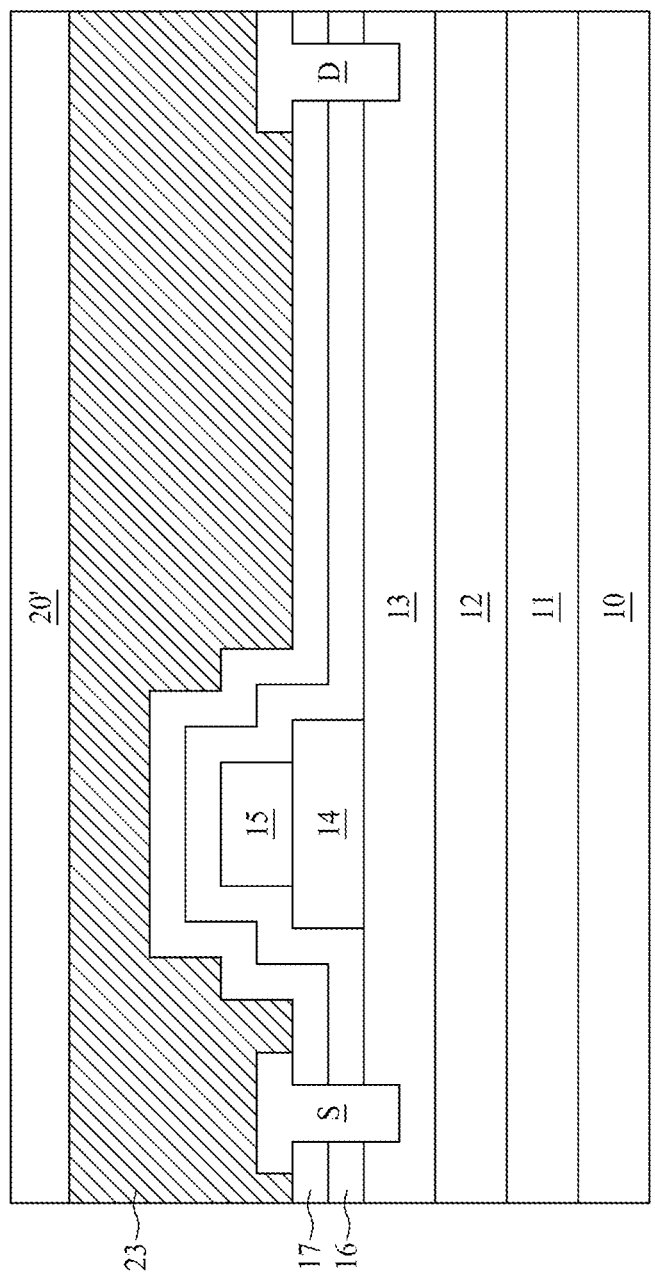

Referring to FIG. 5C, the conductive material is deposited on the dielectric layer 23 to form a metal layer 20'.

Figure 5D:
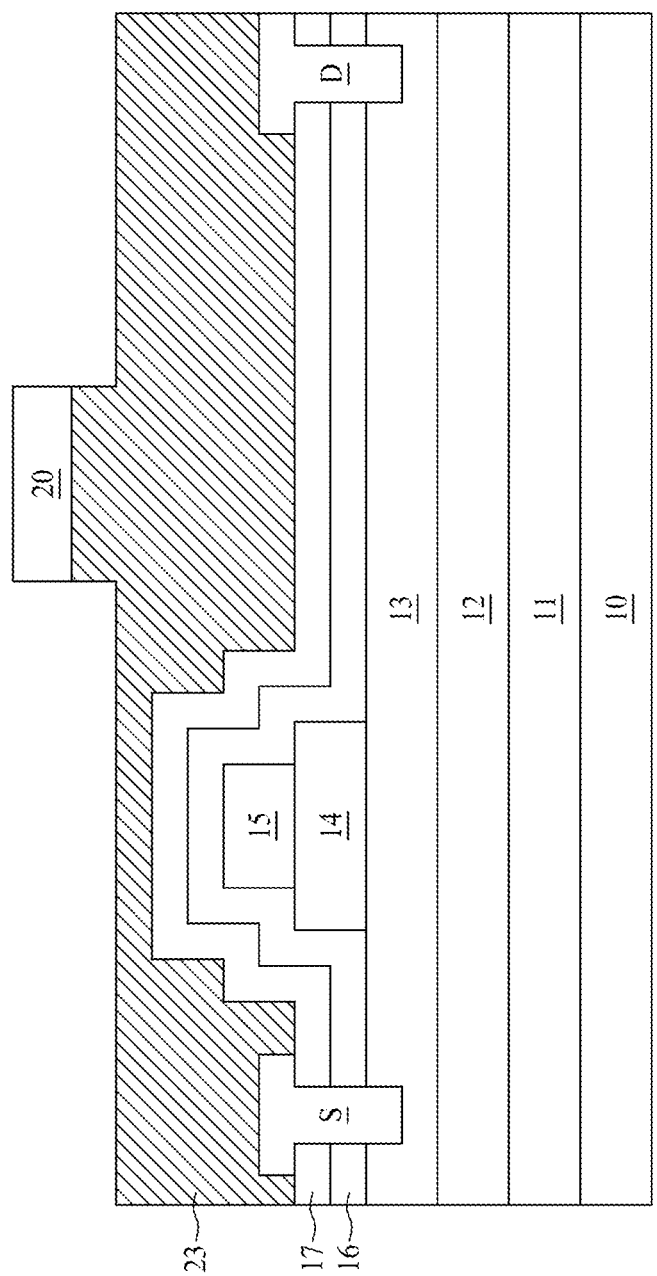

Referring to FIG. 5D, the metal layer 20' is patterned to form the field plate 20. The metal layer 20' may be patterned through photolithography, etching, and other processes. During patterning of the metal layer 20', the dielectric layer 23 located under the metal layer 20' is also etched partially. For example, a region of the dielectric layer 23 that is not covered by the field plate 20 is etched, and a region covered by the field plate 20 is not etched.

Figure 5E:
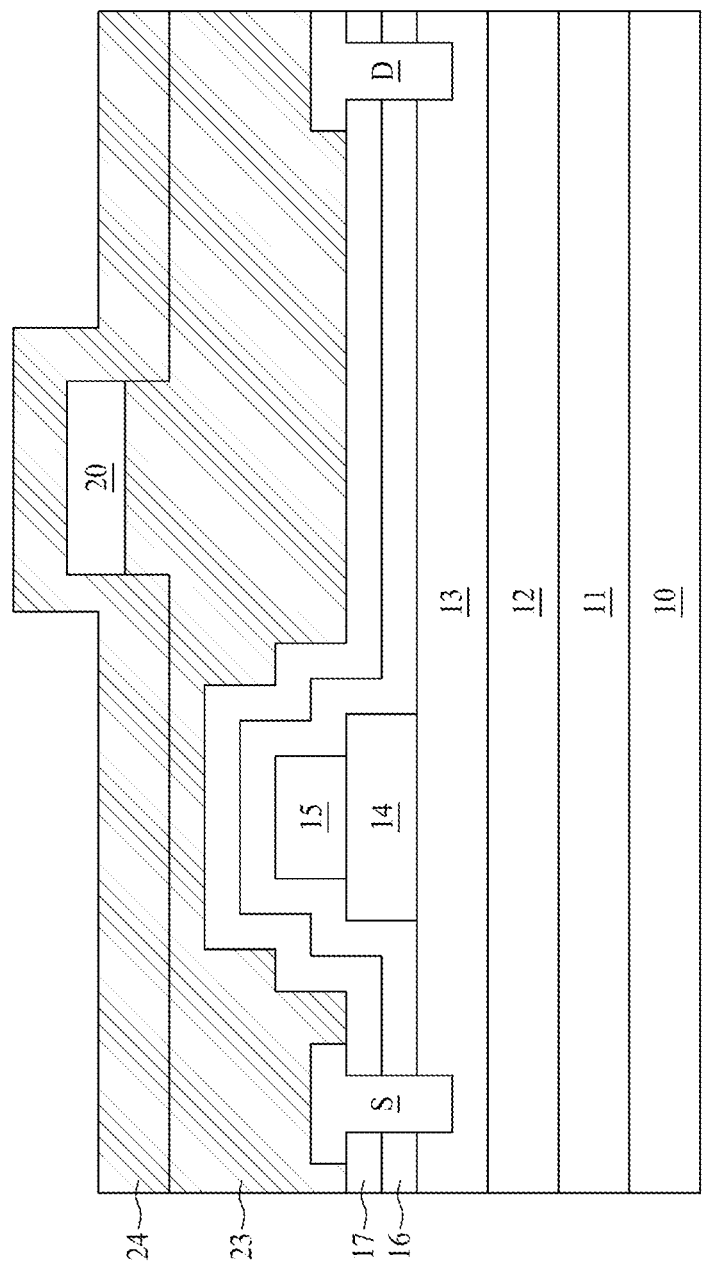

Referring to FIG. 5E, a dielectric layer 24 is deposited on the dielectric layer 23 to cover the field plate 20. In some embodiments, the dielectric layer 24 may be deposited through the following manners: CVD, HDPCVD, spin-on, sputtering, and the like. Next, a surface of the dielectric layer 24 may be processed by using CMP.

Figure 5F:
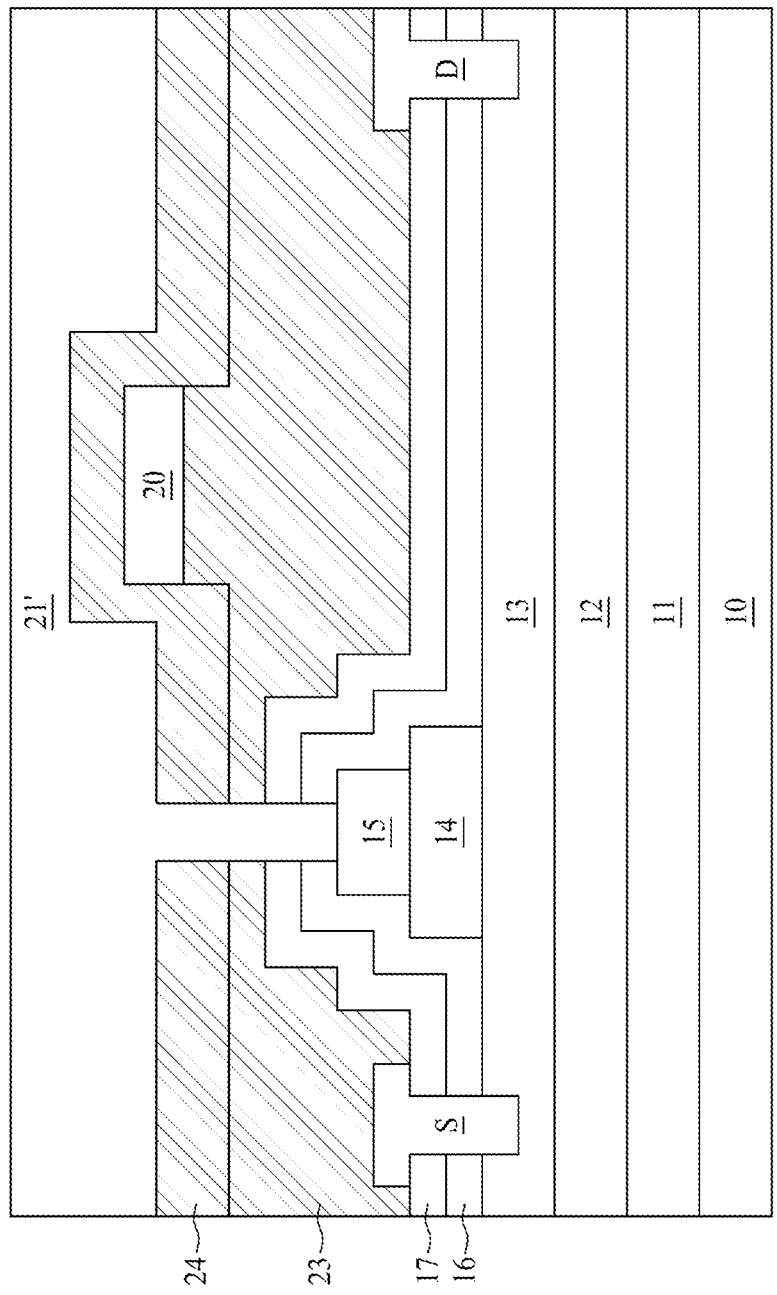

Referring to FIG. 5F, an opening is formed to expose a local surface of the metal layer 15. In some embodiments, the opening may be formed through dry etching or wet etching. For example, the wet etching includes exposing to a solution containing hydroxides, deionized water, and/or other etching agents. The dry etching includes using inductively coupled plasma. The metal layer 15 may be used as a stop layer of the P-type doped semiconductor layer 14 in this step.

Next, the conductive material is deposited in the opening and at an exposed surface of the metal layer 15. The conductive material is also deposited on the dielectric layer 24 to form a metal layer 21'. In some embodiments, the metal layer 21' may be formed through PVD, CVD, ALD, plating, and/or other appropriate deposition steps.

Figure 5G:
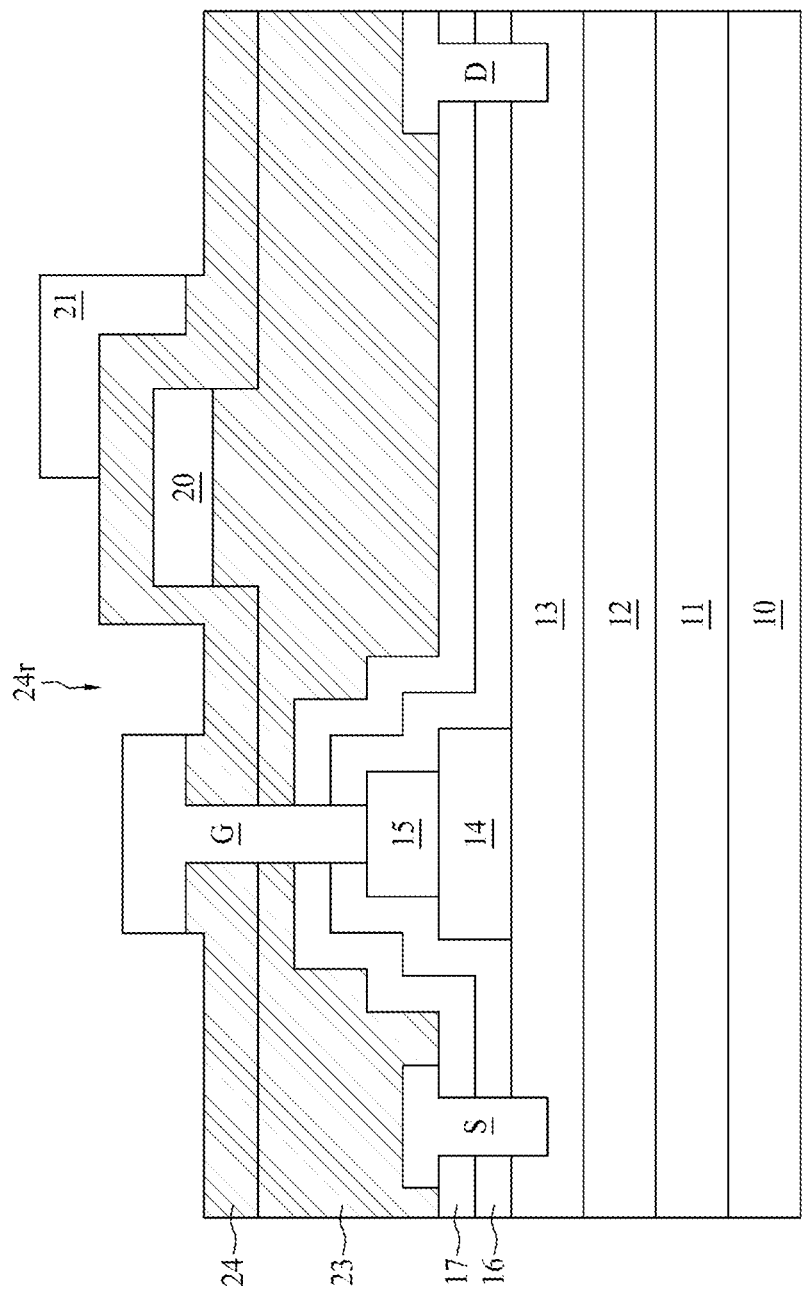

Referring to FIG. 5G, the metal layer 21' is patterned to form a field plate 21 and a gate contact G. The metal layer 21' may be patterned through photolithography, etching, and other processes. In some embodiments, the field plate 21 and the gate contact G may be formed together in the same step. For example, the field plate 21 and the gate contact G may be formed at the same time. For example, the field plate 21 and the gate contact G may be formed in the same process. For example, the field plate 21 and a conductive material of the gate contact G may be deposited together. For example, the field plate 21 and the gate contact G may be patterned together.

During patterning of the metal layer 21', the dielectric layer 24 located under the metal layer 21' is also etched partially to form a recessed portion 24r. For example, a region of the dielectric layer 24 that is not covered by the field plate 21 and the gate contact G is etched, and a region covered by the field plate 21 and the gate contact G is not etched. The recessed portion 24r may be located between the gate contact G and the field plate 20. The recessed portion 24r may be located between the gate contact G and the field plate 21.

In some embodiments, the field plate 20 may be not formed. Compared with the embodiments having no field plate 20 formed, the forming of the field plate 20 may simplify the process because as shown in FIG. 5G, when the metal layer 21' is etched to form the gate contact G and the field plate 21, the recessed portion 24r may be formed in the dielectric layer 24 in the same process. It should be noted that, if the field plate 20 is not formed, a step of patterning the dielectric layer 23 is required to help to form the recessed portion 24r in the dielectric layer 24 subsequently.

In some embodiments, the field plate 21 may be not formed. Compared with the embodiments having no field plate 21 formed, the forming of the field plate 21 may simplify the process because as shown in FIG. 5G, when the metal layer 21' is etched to form the gate contact G and the field plate 21, the recessed portion 24r may be formed in the dielectric layer 24 in the same process. It should be noted that, if the field plate 21 is not formed, a step of patterning the dielectric layer 24 is required to help to form the recessed portion 24r in the dielectric layer 24.

Figure 5H:
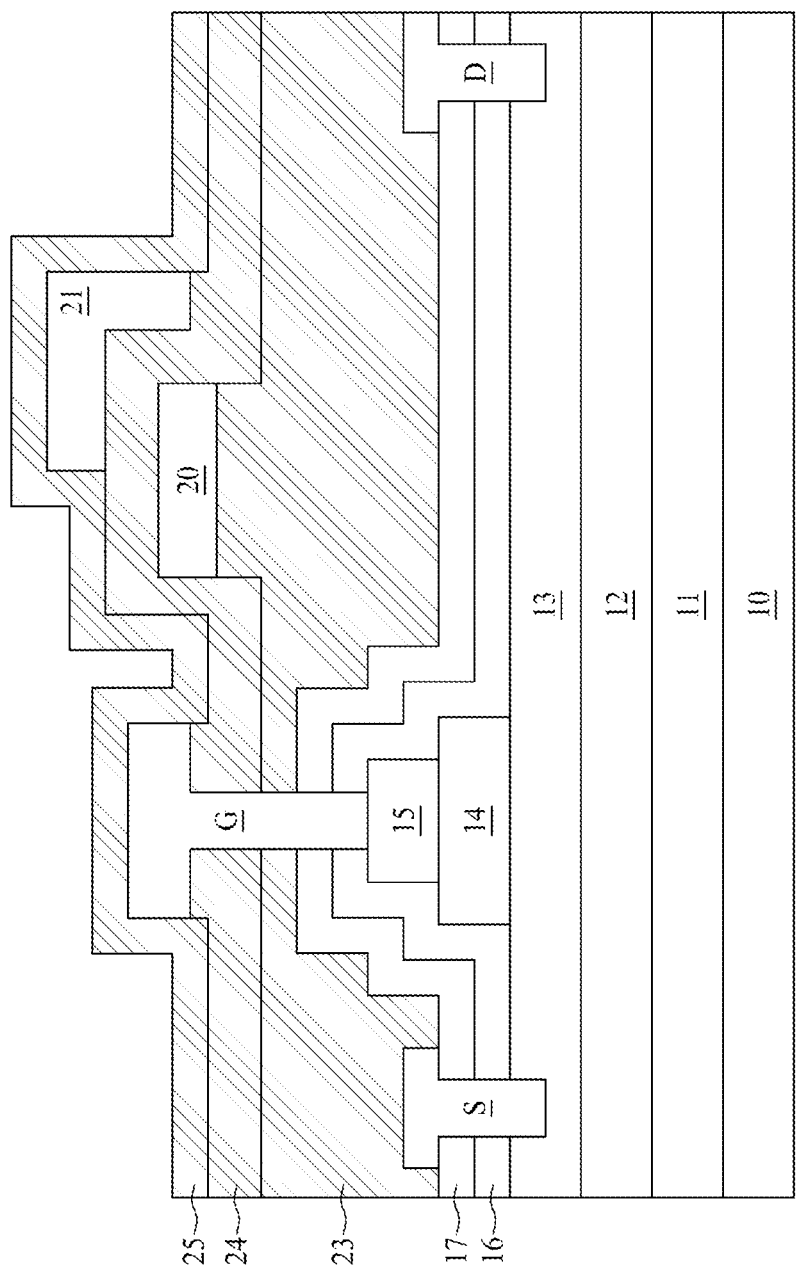

Referring to FIG. 5H, a dielectric layer 25 is deposited on the dielectric layer 24 to cover the field plate 21 and the gate contact G. The dielectric layer 25 is also deposited in the recessed portion 24r. In some embodiments, the dielectric layer 25 may be deposited through the following manners: CVD, HDPCVD, spin-on, sputtering, and the like. Next, a surface of the dielectric layer 25 may be processed by using CMP.

Figure 5I:
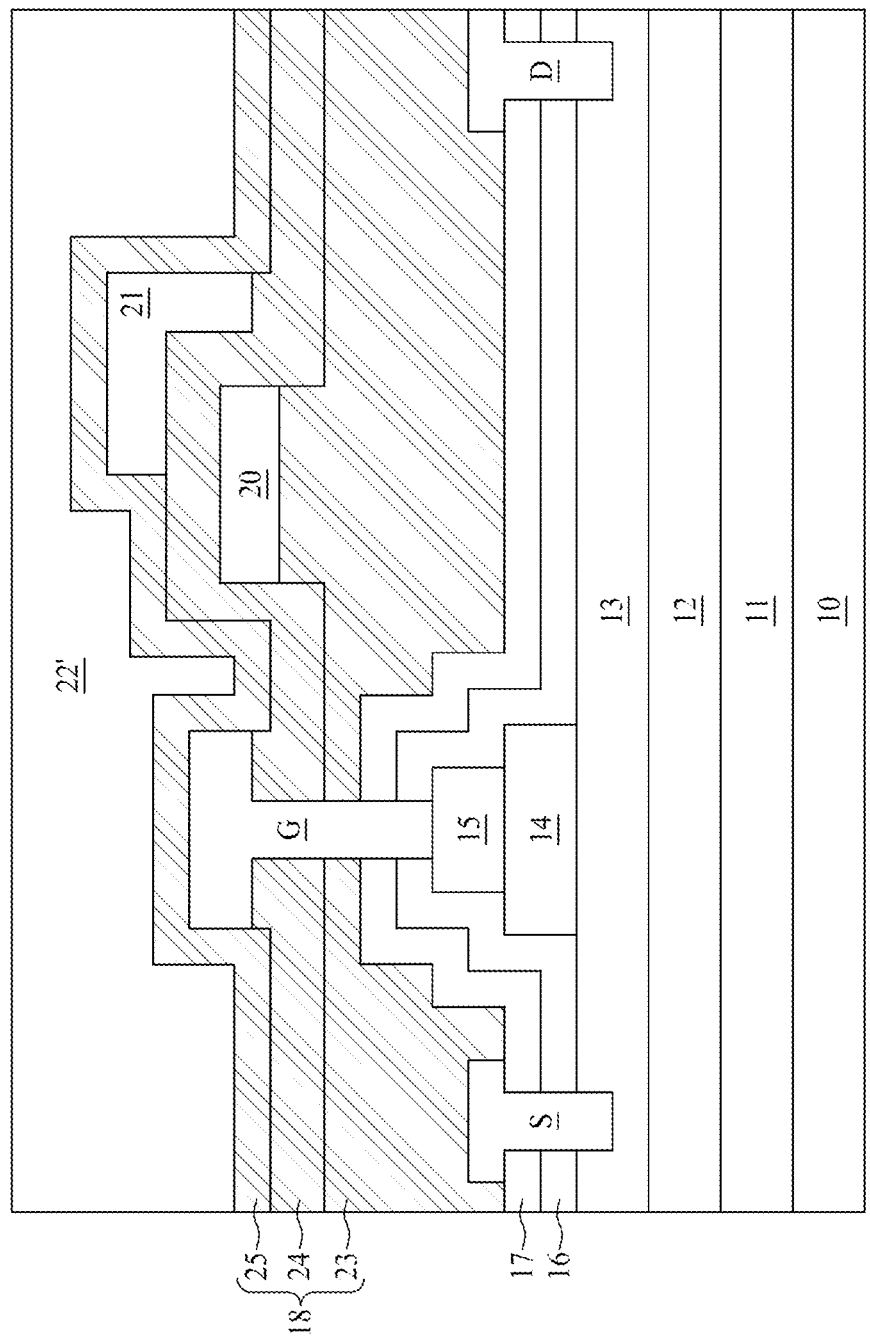

Referring to FIG. 5I, the conductive material is deposited on the dielectric layer 25 to form a metal layer 22'. The conductive material is also deposited in the recessed portion 24r, to form the protruded portion 22p shown in FIG. 1.

Figure 5J:
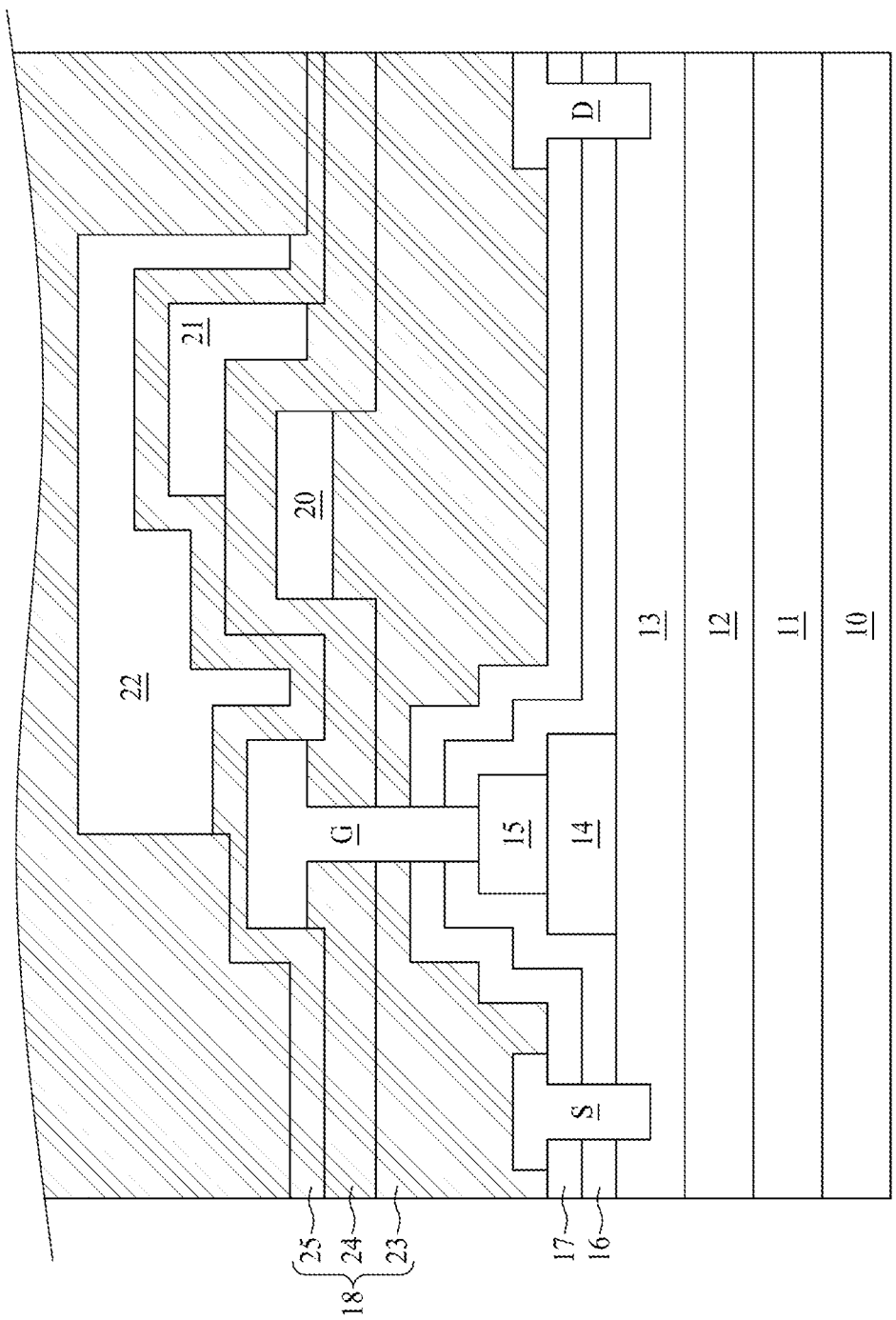

Referring to FIG. 5J, the metal layer 22' is patterned to form the field plate 22. The metal layer 22' may be patterned through photolithography, etching, and other processes. During patterning of the metal layer 22', the dielectric layer 25 located under the metal layer 22' is also etched partially.

For example, a region of the dielectric layer 25 that is not covered by the field plate 22 is etched, and a region covered by the field plate 22 is not etched. Referring to FIG. 5J, the dielectric layer 23, the dielectric layer 24, and the dielectric layer 25 may be regarded as the dielectric layer 18 shown in FIG. 1. Referring to FIG. 5J, the dielectric layer 23, the dielectric layer 24, and the dielectric layer 25 may be defined as the dielectric layer 18 shown in FIG. 1. The semiconductor device 1 shown in FIG. 1 may be formed by using the processes shown in FIG. 5A, FIG. 5B, FIG. 5C, FIG. 5D, FIG. 5E, FIG. 5F, FIG. 5G, FIG. 5H, FIG. 5I, and FIG. 5J. A structure similar to the semiconductor device 1 shown in FIG. 1 may be formed by using the processes shown in FIG. 5A, FIG. 5B, FIG. 5C, FIG. 5D, FIG. 5E, FIG. 5F, FIG. 5G, FIG. 5H, FIG. 5I, and FIG. 5J.

The recessed portion 24r of the dielectric layer 24 is formed through etching by using the process steps shown in FIG. 5A to FIG. 5J, so that the field plate 22 formed later has the protruded portion 22p. Compared with the embodiments not having the protruded portion 22p, the foregoing operations do not need to increase the process steps. In addition, the protruded portion 22p can affect the 2DEG region greatly, and can change the distribution of 2DEG, so as to reduce the gate-to-drain capacitance $C_{GS}$, thereby improving and amplifying the gain.

In addition, in some embodiments, the recessed region may be deeper by further etching the recessed portion 24r of the dielectric layer 24. For example: an etching time may be prolonged during patterning of the metal layer 21' with reference to FIG. 5G. Alternatively, the dielectric layer 25 in the recessed portion 24r may be etched after the dielectric layer 25 is deposited with reference to FIG. 5H.

The present disclosure relates to a semiconductor component and a manufacturing method thereof, and in particular, to a radio frequency semiconductor component having a field plate and a manufacturing method thereof, which have advantages of reducing the capacitance $C_G D$ and simplifying the process. The semiconductor component shown in the present disclosure includes, buts not limited to, a radio frequency semiconductor component, a power component, or the like.

As used herein, for ease of description, space-related terms such as "under", "below", "lower portion", "above", "upper portion", "lower portion", "left side", "right side", and the like may be used herein to describe a relationship between one component or feature and another component or feature as shown in the figures. In addition to orientation shown in the figures, space-related terms are intended to encompass different orientations of the device in use or operation. A device may be oriented in other ways (rotated 90 degrees or at other orientations), and the space-related descriptors used herein may also be used for explanation accordingly. It should be understood that when a component is "connected" or "coupled" to another component, the component may be directly connected to or coupled to another component, or an intermediate component may exist.

As used herein, terms "approximately", "basically", "substantially", and "about" are used for describing and explaining a small variation. When being used in combination with an event or circumstance, the term may refer to a situation in which the event or circumstance occurs precisely, and a situation in which the event or circumstance occurs approximately. As used herein with respect to a given value or range, the term "about" usually means in the range of ±10%, ±5%, ±1%, or ±0.5% of the given value or range. The range may be indicated herein as from one endpoint to another endpoint or between two endpoints. Unless otherwise specified, all ranges disclosed herein include endpoints. The term "basically coplanar" may refer to two surfaces within a few micrometers (μm) positioned along the same plane, for example, within 10 μm, within 5 μm, within 1 μm, or within 0.5 μm located along the same plane. When reference is made to "basically" the same numerical value or characteristic, the term may refer to a value within ±10%, ±5%, ±1%, or ±0.5% of the average of the values.

Several embodiments of the present disclosure and features of details are briefly described above. The embodiments described in the present disclosure may be easily used as a basis for designing or modifying other processes and structures for realizing the same or similar objectives and/or obtaining the same or similar advantages introduced in the embodiments of the present invention. Such equivalent construction does not depart from the spirit and scope of the present disclosure, and various variations, replacements, and modifications can be made without departing from the spirit and scope of the present disclosure.

What is claimed is:

1. A semiconductor device, comprising:
   a substrate;
   a first nitride semiconductor layer disposed on the substrate and having a first bandgap;
   a second nitride semiconductor layer disposed on the first nitride semiconductor layer and having a second bandgap, the second bandgap being larger than the first bandgap;
   a gate contact disposed over the second nitride semiconductor layer; and
   a first field plate disposed over the gate contact,
   wherein the first field plate has a first surface facing the substrate, a second surface facing the substrate, and a protruded portion having a bottom surface facing the substrate,
   wherein the bottom surface is located between the first surface and the second surface;
   a second field plate, disposed between the first field plate and the second nitride semiconductor layer;
   wherein a projection area of the first field plate on the substrate and a projection area of the second field plate on the substrate are at least partially overlapped;
   a third field plate disposed between the second field plate and the second nitride semiconductor layer;
   wherein the protruded portion is located between the gate contact and the third field plate;
   wherein a projection area of the first field plate on the substrate and a projection area of the third field plate on the substrate are at least partially overlapped; and
   wherein at least one of the first and second field plates includes a bent portion at an end of a respective field plate, the bent portion extending toward the substrate.

2. The semiconductor device according to claim 1, wherein the bottom surface is not coplanar with at least one of the first surface and the second surface.

3. The semiconductor device according to claim 2, wherein the bottom surface is not coplanar with the first surface and the second surface.

4. The semiconductor device according to claim 1, wherein the bottom surface is closer to the substrate than the first surface and the second surface are.

5. The semiconductor device according to claim 1, wherein the protruded portion has a side surface facing the gate contact, the side surface being connected to the bottom surface and the first surface.

6. The semiconductor device according to claim 1, wherein the first field plate has a substantially flat upper surface opposite to the first surface and the second surface.

7. The semiconductor device according to claim 1, further comprising:
   a P-type doped semiconductor layer disposed between the second nitride semiconductor layer and the gate contact,
   wherein a distance between the bottom surface and the P-type doped semiconductor layer is between about 100 nm and about 300 nm.

8. The semiconductor device according to claim 1, wherein the protruded portion is located between the gate contact and the second field plate.

9. The semiconductor device according to claim 8, wherein the protruded portion is closer to the gate contact than the second field plate is.

10. The semiconductor device according to claim 1, wherein the protruded portion is closer to the substrate than the second field plate is.

11. The semiconductor device according to claim 1, wherein a projection area of the first field plate on the substrate and a projection area of the second field plate on the substrate are completely overlapped.

12. The semiconductor device according to claim 1, wherein a projection area of the first field plate on the substrate and a projection area of the third field plate on the substrate are completely overlapped.

13. A semiconductor device, comprising:
   a substrate;
   a first nitride semiconductor layer disposed on the substrate and having a first bandgap;
   a second nitride semiconductor layer disposed on the first nitride semiconductor layer and having a second bandgap, the second bandgap being larger than the first bandgap;
   a gate contact disposed over the second nitride semiconductor layer; and
   a first field plate disposed over the gate contact,
   wherein the first field plate has a first part and a second part connected to the first part;
   the first part is spaced apart from the gate contact in a direction substantially parallel to a surface of the substrate, and a projection area of the second part on the substrate and a projection area of the gate contact on the substrate are partially overlapped; and
   wherein the first part has a first thickness and the second part has a second thickness, the first thickness being greater than the second thickness;
   a second field plate, disposed between the first field plate and the second nitride semiconductor layer;
   a third field plate disposed between the second field plate and the second nitride semiconductor layer;
   wherein at least one of the first and second field plates includes a bent portion at an end of a respective field plate, the bent portion extending toward the substrate; and
   wherein the first part is located between the gate contact and the third field plate.

14. The semiconductor device according to claim 13, wherein the first part and the second part are adjacent to the gate contact.

15. The semiconductor device according to claim 13, wherein the first field plate further comprises:
a third part connected to the first part, the first part being located between the second part and the third part.

16. The semiconductor device according to claim 15, wherein the third part has a third thickness, the first thickness being greater than the third thickness.

17. The semiconductor device according to claim 16, wherein the second thickness is different from the third thickness.

18. The semiconductor device according to claim 16, wherein the second thickness is the same as the third thickness.

19. The semiconductor device according to claim 14, wherein the first part has a bottom surface facing the substrate and a side surface facing the gate contact.

20. The semiconductor device according to claim 19, wherein the first field plate has a substantially flat upper surface opposite to the bottom surface of the first part.

21. The semiconductor device according to claim 13, further comprising:
a P-type doped semiconductor layer disposed between the second nitride semiconductor layer and the gate contact,
wherein the first part has a bottom surface facing the substrate, and a distance between the bottom surface and the P-type doped semiconductor layer is between about 100 nm and about 300 nm.

22. The semiconductor device according to claim 13, wherein the first part is located between the gate contact and the second field plate.

23. The semiconductor device according to claim 22, wherein the first part is closer to the gate contact than the second field plate is.

24. The semiconductor device according to claim 13, wherein the first part is closer to the substrate than the second field plate is.

25. The semiconductor device according to claim 13, wherein a projection area of the first field plate on the substrate and a projection area of the second field plate on the substrate are at least partially overlapped.

26. The semiconductor device according to claim 13, wherein a projection area of the first field plate on the substrate and a projection area of the second field plate on the substrate are completely overlapped.

27. The semiconductor device according to claim 13, wherein a projection area of the first field plate on the substrate and a projection area of the third field plate on the substrate are at least partially overlapped.

28. The semiconductor device according to claim 13, wherein a projection area of the first field plate on the substrate and a projection area of the third field plate on the substrate are completely overlapped.

29. A manufacturing method of the semiconductor device according to claim 1, comprising:
providing the substrate;
forming the first nitride semiconductor layer on the substrate, the first nitride semiconductor layer having the first bandgap;
forming the second nitride semiconductor layer on the first nitride semiconductor layer, the second nitride semiconductor layer having the second bandgap larger than the first bandgap;
forming the first field plate on the second nitride semiconductor layer;
forming a first dielectric layer on the second nitride semiconductor layer to cover the first field plate;
forming the gate contact on the first dielectric layer;
removing a part of the first dielectric layer to form a recessed portion between the gate contact and the first field plate;
forming the second field plate on the first dielectric layer; and
forming the third field plate on the first field plate and the second field plate, wherein the third field plate has a portion located in the recessed portion.

30. The manufacturing method of a semiconductor device according to claim 29, wherein the gate contact and the second field plate are formed together.

* * * * *